United States Patent [19]

Porter

[11] Patent Number: 4,822,295
[45] Date of Patent: Apr. 18, 1989

[54] SMALL OUTLINE SMT TEST CONNECTOR

[75] Inventor: Warren W. Porter, Escondido, Calif.

[73] Assignee: NCR Corporation, Dayton, Ohio

[21] Appl. No.: 136,178

[22] Filed: Dec. 17, 1987

[51] Int. Cl.[4] .............................................. H01R 23/72
[52] U.S. Cl. ................................... 439/330; 439/912
[58] Field of Search ................................. 439/68–73, 439/264, 269, 330, 345, 711, 713, 912; 324/158 F, 158 P

[56] References Cited

U.S. PATENT DOCUMENTS

| | | | |
|---|---|---|---|
| 3,573,617 | 4/1971 | Randolph et al. | 324/158 |
| 3,701,077 | 10/1972 | Kelly, Jr. | 324/158 F |
| 4,068,170 | 1/1978 | Chayka et al. | 324/72.5 |
| 4,112,363 | 9/1978 | Morrison et al. | 324/158 |
| 4,195,258 | 3/1980 | Yen | 324/73 |
| 4,298,837 | 11/1981 | Koslar | 324/72.5 |
| 4,419,626 | 12/1983 | Cedrone et al. | 324/158 |
| 4,473,798 | 9/1984 | Cedrone et al. | 324/158 |
| 4,498,047 | 2/1985 | Hexamer et al. | 324/158 |
| 4,508,403 | 4/1985 | Weltman et al. | 439/502 |
| 4,593,820 | 6/1986 | Antonie et al. | 209/573 |
| 4,639,058 | 1/1987 | Morgan | 324/158 F |
| 4,671,592 | 6/1987 | Ignasiak et al. | 439/264 |
| 4,735,580 | 4/1988 | Hansen et al. | 439/264 |

FOREIGN PATENT DOCUMENTS 1246101  9/1971  United Kingdom ............ 324/158 F Primary Examiner—Neil Abrams
Attorney, Agent, or Firm—Wilbert Hawk, Jr.; Jack R. Penrod; Gregory P. Gadson

[57] ABSTRACT

An electrical test connector for a small outline surface mount technology (SO SMT) package or the like comprises an insulative body which holds the test conductors in an arrangement at one end to connect to the leads of the SO SMT package under test without causing accidental short circuits, and at the other end in a second, more widely spaced arrangement to facilitate the connection of test leads. The test clip is held in place by two gripping members which grip the opposing ends of the SO SMT package. A slide unit, when in the test position, supplies the force which causes the gripping members to grip the ends of the SO SMT package. Removal of the test connector from the SO SMT package is easily achieved by moving the slide unit to the release position where it does not supply the force to the gripping members to grip the SO SMT package tightly. The ambit or "footprint" of the test connector is substantially the same as the ambit of the SO SMT package including the leads.

1 Claim, 3 Drawing Sheets

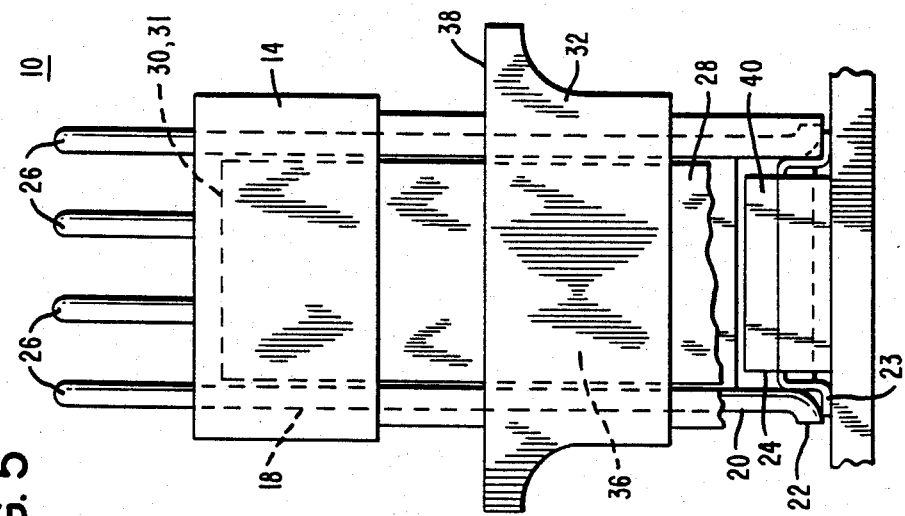
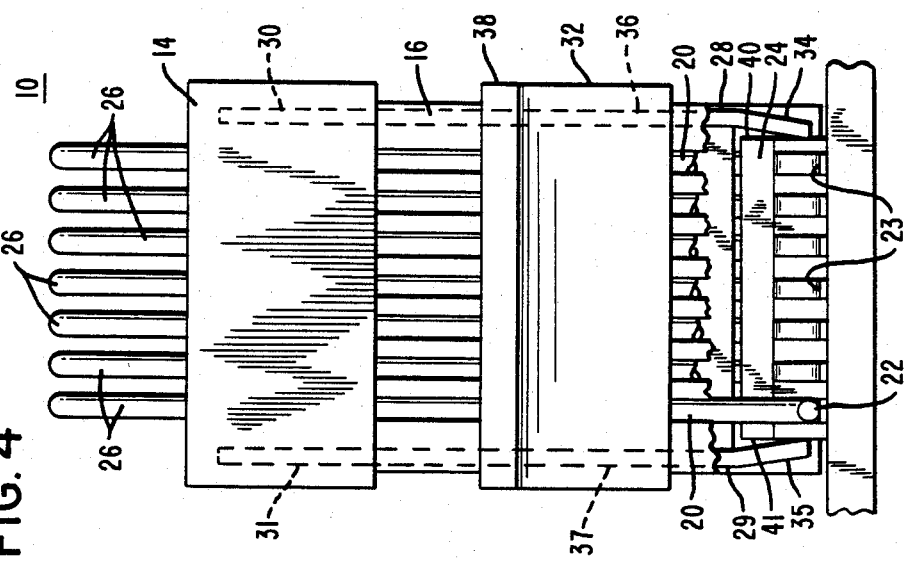

SMALL OUTLINE SMT TEST CONNECTOR

BACKGROUND OF THE INVENTION

The present invention relates to in-circuit, electrical test connectors and, more particularly, to in-circuit, electrical test connectors for surface mount technology (SMT) packages for integrated circuits and components.

SMT packages are part of an advanced, high density circuit technology presently used for the automated assembly and manufacture of printed circuit boards. SMT packages are rapidly replacing the larger dual-in-line packages (DIP's) as noted in the article by M. Chester entitled "Update: Surface-mountable Resistor Networks" appearing in the Aug. 1, 1987 issue of Electronic Products at page 19. DIP's, which are still the most popular mounting for integrated circuits and other types of components, have leads that are typically inserted by automated equipment into holes in a printed circuit board. These leads are subsequently wave soldered to the printed circuit board. This technique requires the drilling of a pattern of holes in the printed circuit board for each DIP used, which takes extra design and manufacture time. Further, the DIP's have larger, longer leads than SMT packages because the leads must structurally support the larger body of the package above the printed circuit board for convection cooling purposes. Since printed circuit boards have progressed to more compact and denser physical sizes, it has become obvious that the traditional DIP must be replaced by a smaller package, which likewise can be used with automated assembly equipment.

One of the more popular packages for automated printed circuit board assembly is the small outline (SO) SMT package. In assembly, each SO SMT package is located by the automated part locator and subsequently affixed in its respective position upon the awaiting conductor pads of the printed circuit board.

Some SO SMT packages are held in position on the printed circuit board by the solder paste which coats the leads, while other packages are held by a combination of solder paste on the leads and an adhesive between the printed circuit board and the SO SMT package. The solder paste on the leads is a special low melting temperature type which becomes molten when heated in a special temperature regulated chamber. The molten solder flows between the horizontal portions of the gull wing shaped leads of the SO SMT package and their respective conductor pads of the printed circuit board when the chamber reaches a predetermined temperature. The heat of the chamber not only solders the leads to the conductor pads, but also cures the adhesive for those SO SMT packages which are mounted with an adhesive. The soldered leads, or the soldered leads in combination with an adhesive, form a strong supportive bond between the SO SMT packages and the printed circuit board. Thus, the SO SMT packages receive structural support from the leads or the combination of the leads and the adhesive with the printed circuit board. After soldering, the SO SMT package has a clearance of approximately 0.10 mm with the printed circuit board which may or may not be occupied by the adhesive.

Because the SO SMT package is substantially smaller and lighter than its DIP counterpart, the leads can be made smaller and can be located closer together than the leads of a DIP package. Furthermore, SO SMT integrated circuits and components are typically of the low power variety which do not have to be mounted with both the top and bottom surfaces exposed for cooling. Thus, SO SMT packages are smaller and the circuits using SO SMT packages are denser, which is another way of saying the product is more compact for an equivalent functionality.

DIP's, as well as SO SMT packages, present a problem during testing, especially when in-circuit testing of a package mounted on a printed circuit board is involved. In the case of a DIP, the leads are so close together that it is necessary to use some type of test connector between the DIP-under-test and the test equipment. Otherwise, the circuit might be damaged during testing due to inadvertent connections to ground, power supplies, or other inappropriate connection. One such test connector is shown in U.S. Pat. No. 3,506,949 entitled "Electrical Connector Clip Device" by Venaleck et al., in which a number of conductors are held against the DIP leads by the combined action of a spring and two pivotally mounted jaws ending in a number of tooth-like projections. The projections hook onto the underside of the DIP component in order to keep the clip from sliding off. Such a clip would not work on SO SMT components because the tooth-like projections do not fit between the bottom surface and the printed circuit board. The inability of this known test clip to grasp the bottom surface would prevent it from making good connections to the leads, and furthermore, would not prevent the clip from sliding off even if it were scaled down to the appropriate size.

A specialized test clip for DIP's is shown in U.S. Pat. No. 4,055,800 entitled "Test Clip for Electronic Chips" by Fisk et al. This patent also discloses a device which has a number of conductors that are held against the DIP leads by two pivotally mounted jaws. Instead of a spring, however, the jaws are held against the DIP leads by a cam. It is evident from the shape of the jaws that the seating and locking upon the package denotes locking from the underside. As in Venaleck et al. mentioned above, the jaws cannot grasp and seat upon a SO SMT package. Thus, the only additional feature disclosed by this patent is the camming action used for pivoting the two jaws together.

The U. K. Pat. No. 1,246,101 entitled "Integrated Circuit Testing" by Trickey discloses in FIGS. 3 through 5 a different type of test connector for a DIP component as shown in FIG. 2b thereof. Instead of having two pivotally mounted jaws, this patent discloses a device having fixed side portions which guide and carry flexible, spring-like contacts. The contacts bear against the DIP leads in order to make electrical connections. The test connector is secured to the DIP integrated circuit by two, spring-actuated, pivotally mounted clips which grasp the underside of each end of the DIP integrated circuit by hook-like projections. Such a design would not work for SO SMT test connectors since the underside is generally not available for grasping.

A test connector for a FN type SMT package is shown in U. S. Pat. No. 4,671,590 entitled "Test Clip for PLCC" by M. Ignasiak. The FN type SMT package is rectangular and has leads on all four sides. This type of package has longer, J-shaped leads which curl inwardly as shown on page 7-6 of The TTL Data Book, volume 4 published in 1985 by Texas Instruments. The longer leads allow for a thicker type of adhesive mount and further provide a greater clearance between the underside of the package and the printed circuit board. This clearance is used by the test clip of this patent as a passage for the teeth which grasp the underside of the package, as shown in FIG. 4 thereof. This known type of test clip would not work on the SO SMT packages because the clearance between each SO SMT package and the circuit board is not sufficient to allow such teeth to penetrate beneath and grasp onto the bottom surface. Moreover, the design of this known test clip has four sides which angle outward in all four directions as the normal displacement above the FN type, SMT packages unit-under-test increases. Such a design is not desirable because it prevents the possibility of using two or more test clips while testing adjacent SMT packages unless the packages are fairly well spaced. Wide spacing, however, would be counter to the purpose of using the smaller SMT packages to achieve denser, more compact printed circuit boards.

SUMMARY OF THE INVENTION

Briefly stated, in accordance with one aspect of the invention, the heretofore unmet need for a SO SMT test connector is fulfilled by providing a test connector including an insulative body having a number of channels equally spaced to cooperate with the equal opposing rows of the leads of the SO SMT package. A number of conductors are fixedly mounted to the body with each conductor located in a respective channel. Each conductor has a portion at one end of the insulative body, which is located adjacent to the respective lead of the SO SMT package for electrical contact therewith, and another portion projecting beyond the insulatve body at another end, which is located at a distance from the previous end of the insulative body as the test terminal for the respective lead. A gripper device is connected to the insulative body for firmly gripping the SO SMT package by the two ends located between the two equal, opposing rows of leads.

In another aspect of this invention, a test connector is provided as described in the previous paragraph, further including a slide device, which is slideably connected to the gripper device for converting a sliding force into a gripping force, providing the force for firmly gripping the small outline SMT package.

In yet a further aspect of the invention, a test connector is provided which is substantially the same size as the ambit of the small outline SMT package, including leads, thereby allowing the use of test connectors on adjacent small outline SMT packages.

BRIEF DESCRIPTION OF THE DRAWINGS

While the specification concludes with claims particularly pointing out and distinctly claiming the subject matter which is regarded as the invention, it is believed that the invention will be better understood from the following description of the preferred embodiment taken in conjunction with the accompanying drawings in which:

FIG. 4 is a partially cut away front view of the embodiment shown in FIG. 1 situated in the test position with a SO SMT package; and FIG. 5 is a side view of the embodiment shown in FIG. 4 partially cut away to show internal features.

DESCRIPTION OF THE PREFERRED EMBODIMENT

Figure 1:
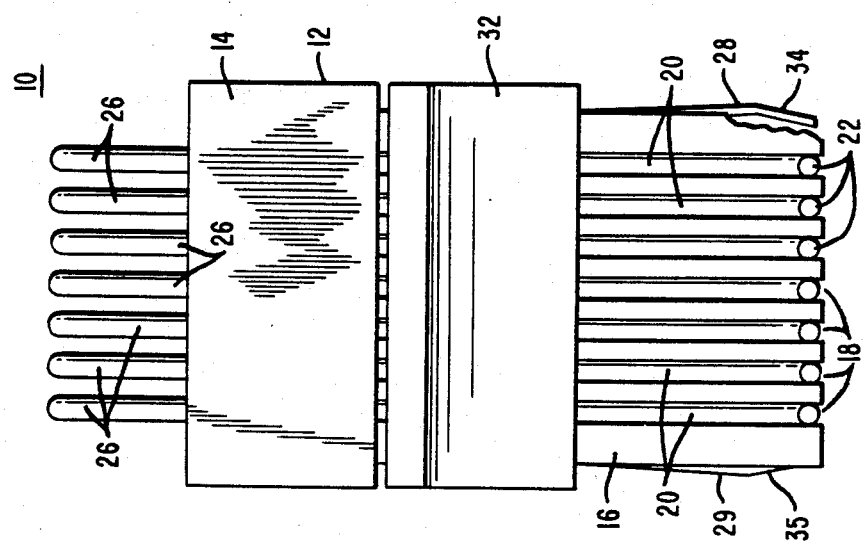
FIG. 1 is a front view of an embodiment of the invention which is partially cut away to show one of the gripper members.

Referring to FIG. 1, there is shown in a partially cut away, front view the preferred embodiment of a test connector 10. The test connector 10 has an insulative body 12 which provides the primary structural support for the test connector 10. The insulative body 12, made of a plastic or other insulating material, includes a cap portion 14 at the top thereof, and a guide portion 16 as the remainder of the insulative body 12. The guide portion 16 has a number of channels or finger-like members 18. In the preferred embodiment, there are fourteen (14) channels 18 which run in parallel with each other throughout the guide portion 16. At the lower end of the insulative body 12, and as seen in FIG. 2, the channels 18 are open both to the inside and the outside.

Figure 2:
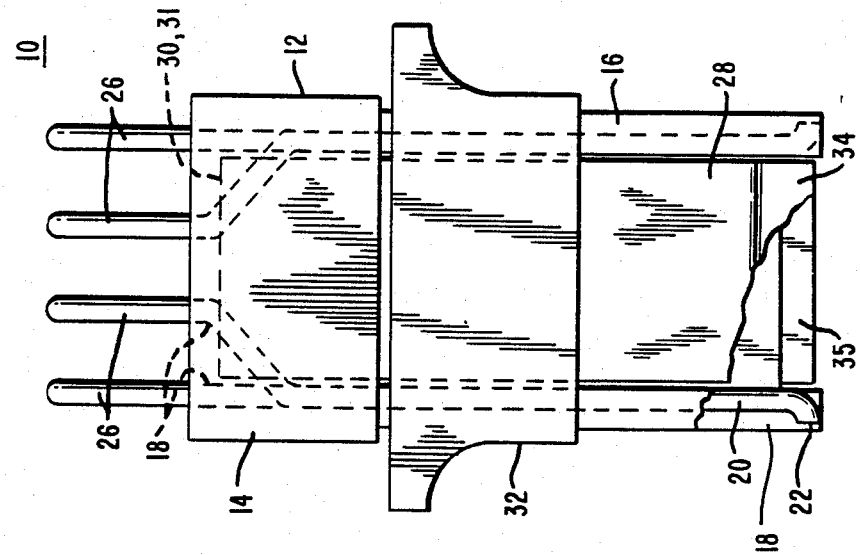
FIG. 2 is a side view of the embodiment shown in FIG. 1 which is partially cut away to show the lower end of one of the conductors.

Turning now to FIG. 2, which is a side view of the connector 10, additional details of the preferred embodiment are shown. The channels 18 become circumferentially enclosed as they leave the guide portion 16 and enter the cap portion 14 of the insulative body 10. Moreover, at the top of cap portion 14 some of the channels 18 angle away from the parallel relationship for a reason which will be explained below. Located in each of the channels 18 is a conductor 20. Each conductor 20 is tightly affixed to the cap portion 14 using known techniques, such as by an injection molding process or by an epoxy adhesive process. This firmly anchors each conductor 20 within the cap 14, providing a structurally strong, cantilever mounting therefor.

The lower ends 22 of the conductors 20 are partially rounded to extend outwardly from the center of the connector 10. This rounding allows the ends 22 to be temporarily pressed onto a SO SMT component without damaging the component through catching or gouging during descent. As mentioned previously, each of the channels 18 is open to the inside at the base of the guide portion 16. This allows each of the conductors 20 to make electrical contact, at its rounded lower end 22, with a respective lead 23 of a SO SMT package 24 in the test position (see FIGS. 4 and 5).

The embodiment shown in FIGS. 1 and 2 has the ends 22 arranged in two parallel rows of seven (7) for connecting to a SO SMT package having fourteen (14) leads. Those skilled in the art will readily recognize that with minor modifications to the number of the leads per row and the spacing of the rows other embodiments of the invention can be realized to accommodate various SO SMT packages.

Figure 3:
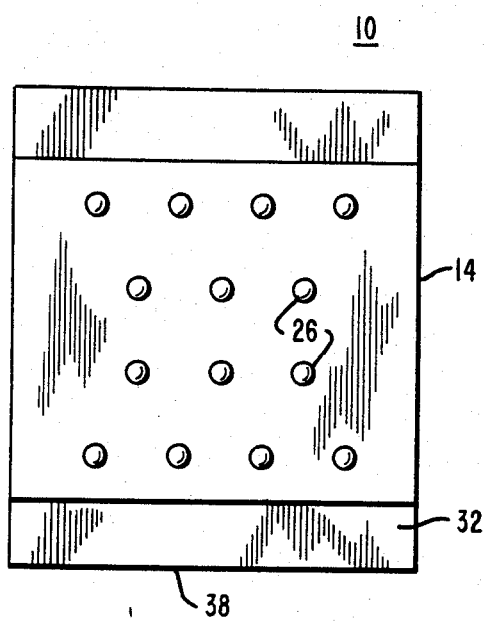
FIG. 3 is a top plan view of the embodiment shown in FIG. 1.

The conductors 20, as shown in FIG. 2, follow the two parallel rows of channels 18 in the guide portion 16, but in the cap portion 14 some of the conductors 20, like some of the channels 18, do not remain in parallel as they pass through. Thus, when all of the conductors 20 emerge from the cap portion 14, an arrangement of four rows of widely spaced test terminals 26 is formed as shown in FIG. 3, instead of the arrangement of two closely spaced rows as is the case at the ends 22.

Referring back to FIG. 2, gripping members 28,29 are located between the two parallel rows of the ends 22 at each end of the guide portion 16. Each gripping member 28,29 has an end 30,31 (FIGS. 4 and 5) which is tightly enclosed by the cap portion 14; thus, each gripping member 28,29 is cantilever mounted in a manner similar to the conductors 18. The gripping members 28,29 are made of a high tensile strength, resilient, durable material, such as metal or fiberglass, in order to withstand the numerous grip/release cycles experienced in the lifetime of the of the test connector, and are shaped such that they flair outwardly near their bottom ends 34,35 when unrestrained.

A slide member 32 surrounds the guide portion 16 and the gripping members 28,29. When the slide member 32 is in the up position as shown in FIG. 2, it does not restrain the gripping members 28,29 from flairing outwardly as they extend from the cap portion 14. This flairing allows the ends 34,35 of the gripping members 28,29 to be separated slightly more than the length of the SO SMT package 24 to be tested (see FIG. 4). This separation of the ends 34,35 facilitates the positioning of the test connector 10 into the test position with the SO SMT package 24.

Turning now to FIG. 4, the test connector 10 is shown in the test connection position with the gripping members 28,29 gripping the SO SMT package 24. The ends 34,35 are turned inward slightly to more tightly grip the ends 40,41 of the SO SMT package 24.

The inside of the slide 32 has two bearing surfaces 36,37. These bearing surfaces 36,37 are located near the sides of the gripping members 28,29 when the slide is in the up position. As the slide is lowered to the test position as shown in FIG. 4, the bearing surfaces 36,37 increasingly bear against the sides of the gripping members 28,29 bcause of the outward flair of the gripping members. The downward movement of the slide 32 and its bearing surfaces 36,37 forces the gripping members 28,29 inwardly against the ends 40,41 of the SO SMT package 24. This causes the slightly turned ends 34,35 to grip the ends 40,41 tightly. The force of the gripping members 28, 29 holds the test connector firmly in the test position as long as the slide 32 is lowered.

Preferably, the slide 32, as shown in FIGS. 4 and 5, has a pair of ledges 38 thereon to provide the test operator with a means to manually operate the slide up or down. The ledges 38 can be made quite small in order to allow the simultaneous use of test connectors 10 on adjacent SO SMT packages 24.

In operation, with the slide 32 in the up position, the test connector 10 can be lowered into the test position atop the SO SMT package 24. As the test connector 10 descends, the conductor ends 22 will be pressed in the outward direction by their contact with the leads 23. The conductors 20 may shift position somewhat, but the channels 18 will postion the conductor ends 22 in contact with the leads 23 without slipping off or shorting-out to an adjacent conductor 20. As the slide 32 is lowered by the application of a downward force on the ledges 38, the bearing surfaces 36,37 force the gripping members 28,29 inwardly so that the ends 34,35 of the gripping members 28,29 grip the ends 40,41 of the SO SMT package 24 tightly. This holds the test connector firmly in place so that the test leads may be attached to the test terminals 26 and measurements taken. After the conclusion of the testing, an upward pressure upon the ledges 38 causes the slide to move upward, releasing the gripping members 28,29 from the influence of the bearing surfaces 36,37 and allowing the gripping members 28,29 to return to their slightly flaired outward position. With the gripping members 28,29 in this position, the ends 40,41 of the SO SMT package 24 are no longer tightly gripped and the test connector 10 can be readily removed.

Thus, it will now be understood that there has been disclosed a test connector for a SO SMT package 24 which has not been previously provided. Further, this test connector is sufficiently compact to allow the use of two or more test connectors 10 simultaneously on adjacent SO SMT packages 24.

As will be evident from the foregoing description, certain aspects of the invention are not limited to the particular details of the example illustrated, and it is therefore contemplated that other modifications or applications will occur to those skilled in the art, such as test connectors with a smaller or larger number of leads in the two parallel rows. It is accordingly intended that the claims shall cover all such modifications and applications which do not depart from the true spirit and scope of the invention.

I claim:

1. A test connector for use with an S-type small outline surface mount package mounted on a circuit board and having a plurality of leads arranged in two rows located at opposite ends of said package, and having two opposing ends of the package without leads where a respective single, planar end wall is located, said test connector comprising:

an insulative body having a plurality of finger-like members therein spaced so that one member is located between each of the plurality of leads;

a plurality of conductors, each mounted between respective ones of the plurality of finger-like members;

each of the conductors having a first portion located at a first end of the insulative body for electrical contact with a respective one of the plurality of leads, and a second portion projecting beyond the insulative body at a second end located at a distance from the first end of the insulative body for forming a respective test terminal, said test terminals being arranged with a spacing greater than that of the plurality of leads in order to facilitate connections;

gripper means connected to the insulative body for gripping the small outline surface mount package by the end walls alone, located between the opposing rows of leads; and means for providing a gripping force to the gripper means comprising a hollow slide means slidably surrounding gripper means for converting a sliding force into the gripping force upon the ends walls of the small outline surface mount package.

* * * * *

UNITED STATES PATENT AND TRADEMARK OFFICE
CERTIFICATE OF CORRECTION

PATENT NO.　：　4,822,295
DATED　　　：　April 18, 1989
INVENTOR(S)：　Warren W. Porter

It is certified that error appears in the above-identified patent and that said Letters Patent is hereby corrected as shown below:

Column 6, line 57, after the word "surrounding", insert --the--.

Column 6, line 58, delete "ends" and substitute --end--.

Signed and Sealed this

Tenth Day of October, 1989

Attest:

DONALD J. QUIGG

*Attesting Officer*　　　*Commissioner of Patents and Trademarks*